(12) United States Patent
Chae

(10) Patent No.: US 9,396,066 B2
(45) Date of Patent: Jul. 19, 2016

(54) DATA STORAGE DEVICE AND OPERATING METHOD THEREOF

(71) Applicant: SK HYNIX INC., Icheon (KR)

(72) Inventor: Chol Su Chae, Icheon (KR)

(73) Assignee: SK HYNIX INC., Icheon (KR)

( * ) Notice: Subject to any disclaimer, the term of this patent is extended or adjusted under 35 U.S.C. 154(b) by 77 days.

(21) Appl. No.: 14/318,517

(22) Filed: Jun. 27, 2014

(65) Prior Publication Data

US 2015/0269021 A1 Sep. 24, 2015

(30) Foreign Application Priority Data

Mar. 19, 2014 (KR) .................. 10-2014-0032349

(51) Int. Cl.
| | |
|---|---|
| *G11C 29/52* | (2006.01) |
| *G06F 11/10* | (2006.01) |
| *G11C 29/02* | (2006.01) |
| *G11C 29/54* | (2006.01) |
| *G11C 29/04* | (2006.01) |

(52) U.S. Cl.
CPC ............ *G06F 11/1068* (2013.01); *G11C 29/02* (2013.01); *G11C 29/52* (2013.01); *G11C 2029/0411* (2013.01)

(58) Field of Classification Search
CPC .... G06F 11/1068; G11C 29/02; G11C 29/52; G11C 2029/0411
See application file for complete search history.

(56) References Cited

U.S. PATENT DOCUMENTS

| | | | | |
|---|---|---|---|---|
| 8,555,139 | B1* | 10/2013 | Yang .................. | H03M 13/1102 714/757 |
| 2009/0132875 | A1* | 5/2009 | Kitahara ............. | G06F 11/1068 714/721 |
| 2009/0207671 | A1* | 8/2009 | Yu ........................ | G11C 7/1006 365/189.07 |
| 2010/0199149 | A1* | 8/2010 | Weingarten ......... | G06F 11/1068 714/773 |
| 2010/0211852 | A1* | 8/2010 | Lee ...................... | G06F 11/1068 714/773 |
| 2013/0077400 | A1* | 3/2013 | Sakurada ........... | G11C 11/5642 365/185.03 |

FOREIGN PATENT DOCUMENTS

KR 10-2011-0108670 A 10/2011

* cited by examiner

*Primary Examiner* — Cynthia Britt
*Assistant Examiner* — Dipakkumar Gandhi

(57) ABSTRACT

An operating method of a data storage device includes performing an error correcting operation for first data and verifying the error correcting operation to determine whether one or more error decision bits determined as an error through the error correcting operation are actual error bits or normal bits, when a result of the error correcting operation is a pre-correction success.

20 Claims, 4 Drawing Sheets

DATA STORAGE DEVICE AND OPERATING METHOD THEREOF

CROSS-REFERENCES TO RELATED APPLICATION

The present application claims priority under 35 U.S.C. §119(a) to Korean Patent Application number 10-2014-0032349, filed on Mar. 19, 2014, in the Korean Intellectual Property Office, which is incorporated herein by reference in its entirety.

BACKGROUND

1. Technical Field

Various embodiments relate to a data storage device, and more particularly, to a data storage device and an operating method of an ECC (error correction code) circuit included in the data storage device.

2. Related Art

A data storage device stores data provided from an external device, in response to an external write request. Also, the data storage device provides stored data to the external device, in response to an external read request. The data storage device includes a nonvolatile memory device for storing data.

Nonvolatile memory devices retain stored data even when power is not supplied. Nonvolatile memory devices include flash memory devices such as NAND flash and NOR flash memory devices, FeRAM (ferroelectric random access memory) devices, PRAM (phase-change random access memory) devices, MRAM (magnetic random access memory) devices and ReRAM (resistive random access memory) devices.

Data transmitted to an external device from a data storage device according to an external read request may be damaged due to various reasons, and may thus include errors. Errors included in the data may occur when or while the data are stored in the data storage device. The errors included in the data may occur while the data are transmitted to the external device through a data bus after being read from the data storage device. The data storage device may include an ECC (error correction code) circuit for detecting and correcting the errors included in the data.

SUMMARY

In an embodiment of the present invention, an operating method of a data storage device may include: performing an error correcting operation for first data; and verifying the error correcting operation to determine whether one or more error decision bits determined as an error through the error correcting operation are actual error bits or normal bits, when a result of the error correcting operation is indicated as a pre-correction success.

In an embodiment of the present invention, a data storage device may include: a nonvolatile memory apparatus configured to read first data stored therein; and an Error Correcting Code (ECC) circuit configured to perform an error correcting operation for the first data, and determine whether one or more error decision bits determined as an error through the error correcting operation are actual error bits or normal bits, when a result of the error correcting operation is indicated as a pre-correction success.

In an embodiment of the present invention, an operating method of a data storage device may include: performing an error correcting operation for first data; and verifying whether an actual error in the first data is corrected through the error correcting operation, based on a threshold voltage of a memory cell corresponding to an error decision bit determined as an error in the first data by the error correcting operation.

BRIEF DESCRIPTION OF THE DRAWINGS

Features, aspects, and embodiments are described in conjunction with the attached drawings, in which.

DETAILED DESCRIPTION

Hereinafter, a data storage device and an operating method thereof according to the present disclosure will be described below with reference to the accompanying drawings through illustrative embodiments.

Figure 1:
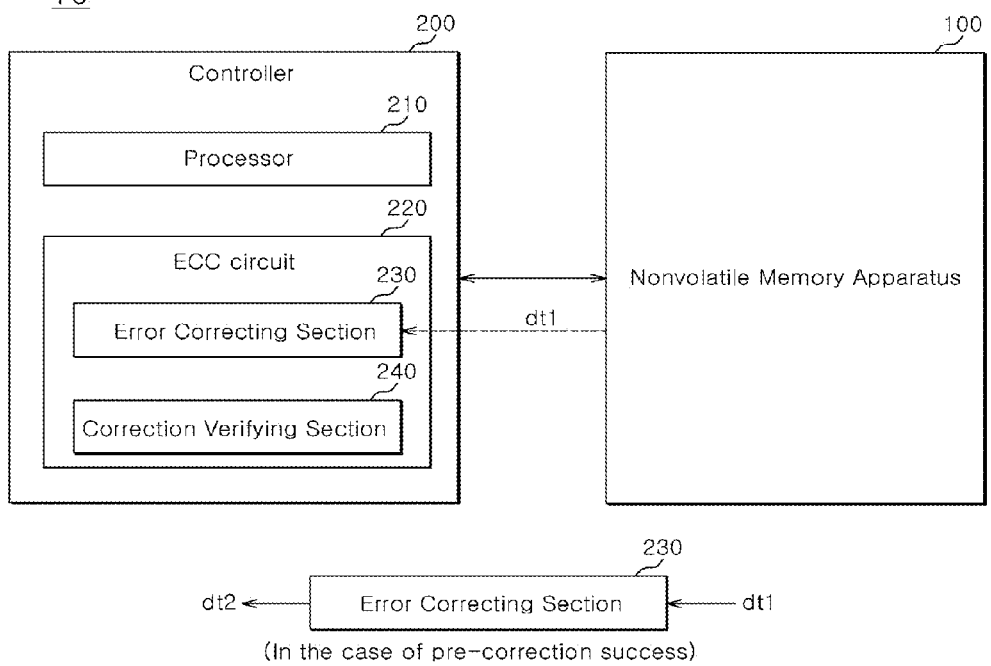
FIG. 1 is a block diagram showing a data storage device in accordance with an embodiment of the present disclosure.

FIG. 1 is a block diagram showing a data storage device 10 in accordance with an embodiment of the present disclosure. The data storage device 10 includes a nonvolatile memory apparatus 100 and a controller 200.

The nonvolatile memory apparatus 100 includes a plurality of memory cells for storing data. The nonvolatile memory apparatus 100 may read first data dt1 from the memory cells in response to a command which is transmitted from the controller 200 as a result of an external read request, and transmit the read first data dt1 to the controller 200.

The controller 200 includes a processor 210 and an error correction code (ECC) circuit 220.

The processor 210 controls general operations of the data storage device 10. For example, the processor 210 may control a write operation or a read operation with respect to the nonvolatile memory apparatus 100.

The ECC circuit 220 includes an error correcting section 230 and a correction verifying section 240.

The error correcting section 230 performs an error correcting operation for the read first data dt1. The error correcting section 230 may detect error bits included in the first data dt1 through the error correcting operation according to an error correction code algorithm, and correct the detected error bits. The error correcting section 230 may correct the error bits included in the first data dt1, within a predetermined error correction capability indicating the number of error bits the error correcting section 230 is designed to properly correct. The error correcting section 230 may indicate that the result of the error correcting operation is a pre-correction success or a correction fail. When the result of the error correcting operation is the pre-correction success, the error correcting section 230 may output second data dt2 as an error correction result for the first data dt1.

When the number of the error bits included in the first data dt1 is equal to or smaller than the error correction capability, the error correcting section 230 may correct the error bits and output the second data dt2. Further, the error correcting section 230 indicates that the result of the error correcting operation is the pre-correction success.

When the number of the error bits included in the first data dt1 exceeds the error correction capability, the error correcting section 230 may not correct the error bits, may output the result of the error correcting operation as the correction fail, and may not output the second data dt2 as an error correction result.

In some exceptional cases wherein the number of the error bits included in the first data dt1 exceeds the error correction capability, the error correcting section 230 may wrongly indicate that the result of the error correcting operation is the pre-correction success, due to a structural limitation in the error correction code algorithm. In an exceptional case, the error correcting section 230 may wrongly decide to attempt to correct the errors by changing normal bits, that is, bits other than the actual error bits, included in the first data dt1. As a result, the error correcting section 230 may output the second data dt2 including not only the existing error bits included in the first data dt1 but also newly generated error bits.

The correction verifying section 240 verifies the corresponding error correcting operation when the result of the error correcting operation is the pre-correction success. That is, the correction verifying section 240 may verify whether the error correcting operation for the actual error bits included in the first data dt1 has been successfully performed or whether the error correcting operation corresponds to the above-described exceptional case even though the result of the error correcting operation is the pre-correction success.

When the correction verifying section 240 determines that the error correcting operation for the actual error bits included in the first data dt1 has been successfully performed, the correction verifying section 240 may indicate that the corresponding error correcting operation is a post-correction success. When the correction verifying section 240 determines that the error correcting operation has been wrongly performed, that is, has identified normal bits as error bits instead of or in addition to identifying the actual error bits included in the first data dt1, the correction verifying section 240 may indicate that the corresponding error correcting operation is a correction fail.

The correction verifying section 240 may verify the error correcting operation based on an error reliability. The error reliability may be calculated based on one or more bits (hereinafter, defined as error decision bits) which are determined as an error through the error correcting operation of the error correcting section 230. In other words, the correction verifying section 240 may verify whether an error decision bit is the actual error bit included in the first data dt1 or the normal bit incorrectly determined to be an error bit.

The controller 200 may transmit the second data dt2 to an external device (not shown) according to the verification result of the correction verifying section 240. When the correction verifying section 240 determines the corresponding error correcting operation is the post-correction success, the controller 200 may transmit the second data dt2 to the external device. When the correction verifying section 240 determines the corresponding error correcting operation is the correction fail, the controller 200 may not transmit the second data dt2 to the external device.

Figure 2:
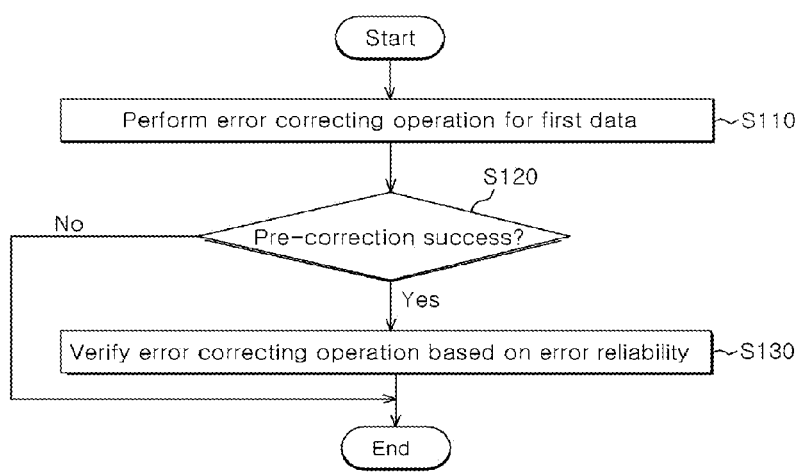
FIG. 2 is a flow chart illustrating the operation of an ECC circuit shown in FIG. 1 according to an embodiment.

FIG. 2 is a flow chart illustrating the operation of the ECC circuit 220 shown in FIG. 1.

Before S110, as a result of an external read request, the first data dt1 is read from the nonvolatile memory apparatus 100 and transmitted to the ECC circuit 220 of the controller 200.

At S110, the error correcting section 230 performs the error correcting operation for the first data dt1. The error correcting section 230 may indicate that the result of the error correcting operation is the pre-correction success or the correction fail.

At S120, when the result of the error correcting operation is the pre-correction success, the process proceeds to S130. When the result of the error correcting operation is the correction fail, the operation of the ECC circuit 220 is ended.

At S130, the correction verifying section 240 verifies the error correcting operation based on the error reliability. When the correction verifying section 240 determines that error decision bits are the actual error bits included in the first data dt1, the correction verifying section 240 may indicate that the error correcting operation is the post-correction success. On the other hand, when the correction verifying section 240 determines that error decision bits are the normal bits included in the first data dt1, the correction verifying section 240 may indicate that the error correcting operation is the correction fail.

Figure 3:
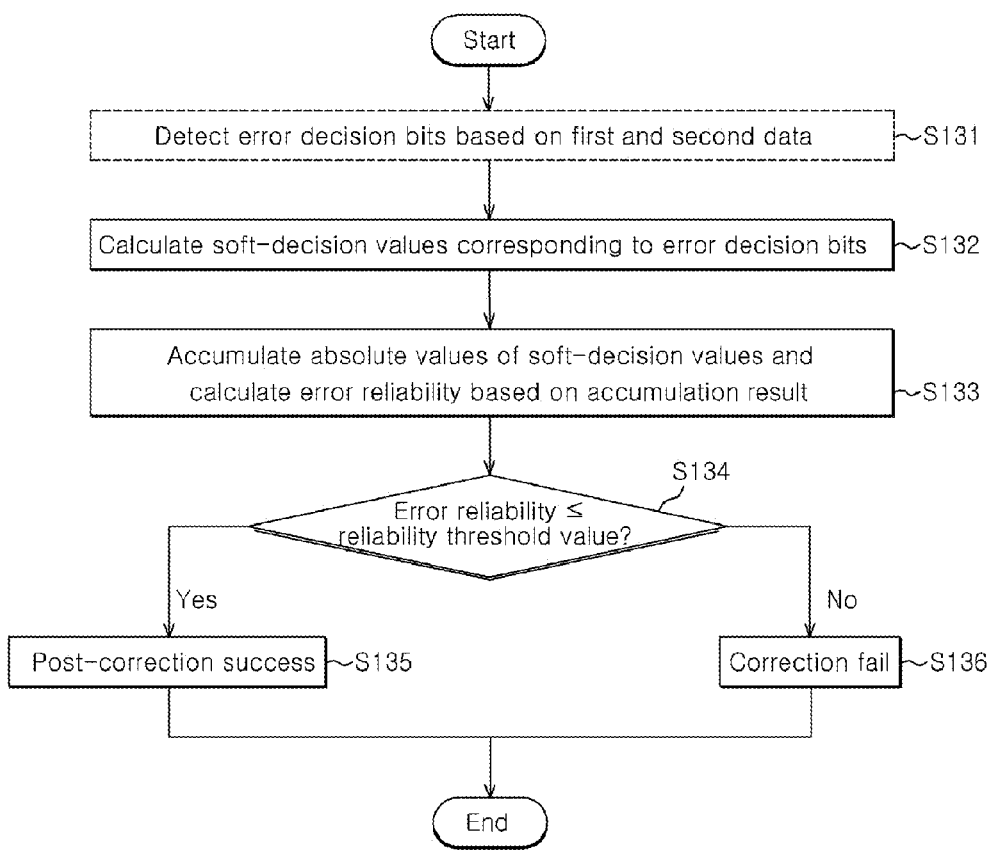
FIG. 3 is a flow chart illustrating the operation of a correction verifying section shown in FIG. 1 according to an embodiment.

FIG. 3 is a flow chart illustrating the operation of the correction verifying section 240 shown in FIG. 1, and in particular S130 of FIG. 2, that is, the operation of the correction verifying section 240 to verify an error correcting operation based on an error reliability.

At S131, the correction verifying section 240 detects the error decision bits, which have been decided as errors through the error correcting operation, based on the first and second data dt1 and dt2. The correction verifying section 240 may compare the first and second data dt1 and dt2 with each other, and may detect bits of the second data dt2, which have different values from corresponding bits of the first data dt1, as error decision bits.

In another embodiment, according to the error correction code algorithm, the error decision bits may be detected in the error correcting operation by the error correcting section 230.

At S132, the correction verifying section 240 calculates soft-decision values corresponding to the error decision bits. In detail, the correction verifying section 240 acquires threshold voltages of memory cells corresponding to the error decision bits. The correction verifying section 240 calculates differences between the respective acquired threshold voltages and a reference voltage and defines the differences between the threshold voltages of the memory cells corresponding to the error decision bits and the reference voltage as the soft-decision values.

At S133, the correction verifying section 240 performs an accumulation of the absolute values of the soft-decision values and calculates an error reliability based on a result of the accumulation.

At S134, the correction verifying section 240 performs a comparison between the error reliability and a reliability threshold value. The reliability threshold value may be defined as the limit value of the error reliability when the error decision bits are the actual error bits. The reliability threshold value may be proportional to a number of the error decision bits. When the error reliability is equal to or smaller than the reliability threshold value, the process may proceed to S135. When the error reliability exceeds the reliability threshold value, the process may proceed to S136.

At S135, the correction verifying section 240 indicates that the error correcting operation is the post-correction success.

At S136, the correction verifying section 240 indicates that the error correcting operation is the correction fail.

Figure 4A:
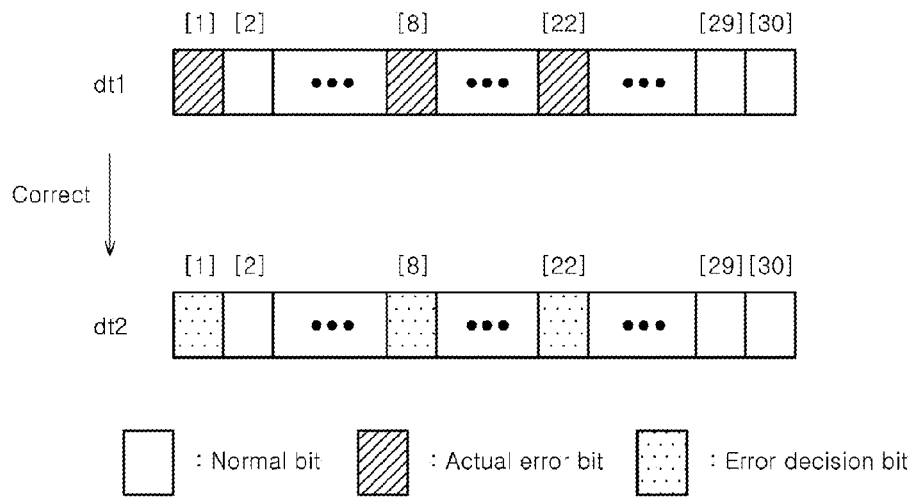
FIGS. 4A and 4B further illustrate an operation of the correction verifying section shown in FIG. 1 according to an embodiment.
Figure 4B:
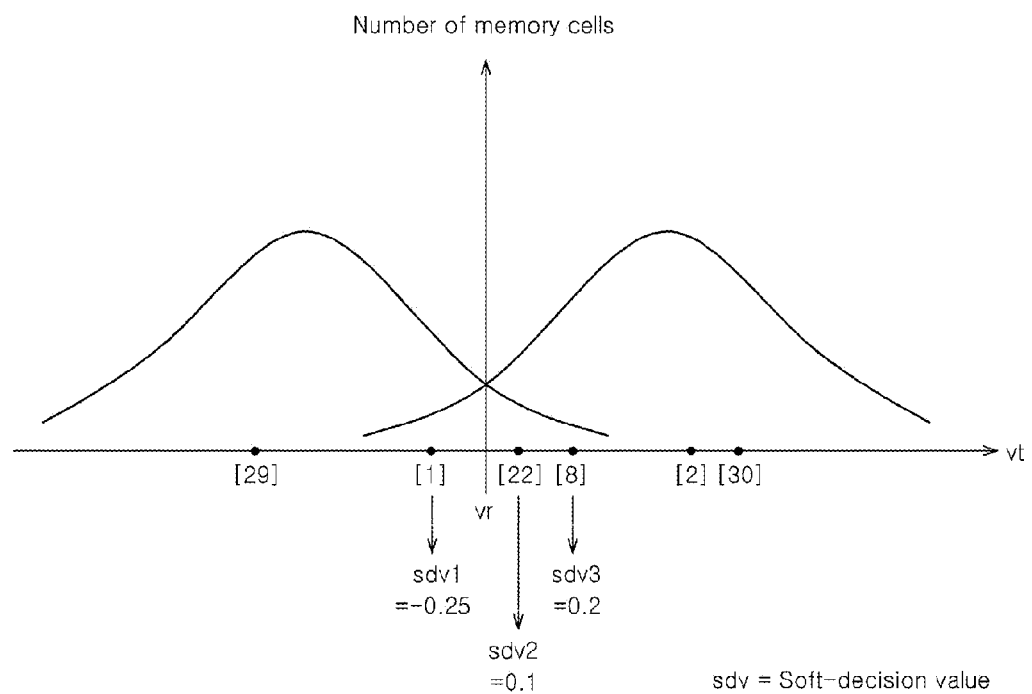

FIGS. 4A and 4B illustrate in detail an operation of the correction verifying section 240 shown in FIG. 1. FIGS. 4A and 4B show the case where the correction verifying section 240 indicates that an error correcting operation which is the pre-correction success is a post-correction success. FIG. 4A shows first data dt1 including error bits 1, 8, and 22 and normal bits 2, 29, and 30, second data dt2 including error decision bits 1, 8, and 22 and normal bits 2, 29, and 30, and FIG. 4B shows a graph of threshold voltage distributions of memory cells including threshold voltages for each of bits 1, 2, 8, 22, 29, and 30 indicated on the horizontal axis of the graph. The second data dt2 are outputted as a result of an error correcting operation for the first data dt1.

The states of memory cells may be changed through the activation of corresponding word lines and bit lines. The change of the state of a memory cell may mean that a threshold voltage of the memory cell is changed. Memory cells may have different states, that is, different threshold voltages, according to data stored therein.

When the data stored in a memory cell is 0, the memory cell may have a threshold voltage larger than a reference voltage. When the data stored in the memory cell is 1, the memory cell may have a threshold voltage smaller than the reference voltage.

However, memory cells storing specific data may show a threshold voltage distribution of a certain range due to different electrical characteristics of the memory cells. Further, memory cells may not retain threshold voltages at a point of time when data are stored because of various factors. As a result, the data read from memory cells may include error bits.

Referring to the threshold voltage distribution of FIG. 4B, when a write operation is performed so as to create threshold values in the memory cells having a sufficient margin from a reference voltage vr, the absolute values of the differences between the threshold voltages of the memory cells corresponding to the normal bits included in the first data dt1 and the reference voltage vr may be relatively large when compared to the absolute values of corresponding differences of error bits. For example, in the case of second, twenty ninth and thirtieth bits in the first data dt1, the absolute values of the differences between the respective threshold voltages of the corresponding memory cells, indicated by points labeled [2], [29], and [30] on the horizontal axis of the graph shown in FIG. 4B, respectively, and the reference voltage vr may be relatively large. In this case, the second, twenty ninth and thirtieth bits may be read as normal bits without errors.

The absolute values of the differences between the threshold voltages of the memory cells corresponding to the error bits included in the first data dt1 and the reference voltage vr may be relatively small when compared to the absolute values of the corresponding differences of normal bits. For example, in the case of first, eighth and twenty-second bits, the absolute values of the differences between respective threshold voltages of the corresponding memory cells, indicated by points labeled [1], [8], and [22] on the horizontal axis of the graph shown in FIG. 4B, respectively, and the reference voltage vr may be relatively small. When this occurs, the probabilities that the data stored in the corresponding memory cells in the write operation was either of 0 and 1 may be substantial. As a result, the first, eighth and twenty-second bits may be determined, when read out, to have values different from the values stored in them during the write operation, and as a result may be read as error bits.

In an embodiment, the error correction capability of the error correcting section 230 is 3. Since the first data dt1 constituted by a total of 30 bits include 3 error bits, e.g., the first, eighth, and twenty-second bits, as shown in FIG. 4A, the error correcting section 230 performs the error correcting operation for the first, eighth and twenty-second bits, and outputs the second data dt2.

In order to verify the error correcting operation, the correction verifying section 240 calculates soft-decision values sdv1, sdv2 and sdv3 corresponding to the error decision bits, that is, the first, twenty-second, and eighth bits, respectively, as shown in FIG. 4B. The soft-decision values sdv1, sdv2 and sdv3 may be the differences between the threshold voltages of the memory cells corresponding to the error decision bits and the reference voltage vr.

The correction verifying section 240 may calculate an error reliability as an accumulated sum of the absolute values of the soft-decision values sdv1, sdv2 and sdv3, having the values of −0.25, 0.1, and 0.2, respectively, as follows:

Error reliability=abs(−0.25)+abs(0.1)+abs(0.2)=0.55, wherein the 'abs' function is an absolute value function.

The reliability threshold value defined as aforementioned may be determined as follows, in which an experiment variable may be obtained by routine experimentation and is assumed to be 0.5 in the present embodiment:

Reliability threshold value=the number of error decision bits*experiment variable=3*0.5=1.5

The correction verifying section 240 performs a comparison between the error reliability and the reliability threshold value. As a result of the comparison, since the error reliability (=0.55) is substantially equal to or smaller than the reliability threshold value (=1.5), the correction verifying section 240 indicates that the error correcting operation is the post-correction success. The correction verifying section 240 determines that the error decision bits are the actual error bits included in the first data dt1. That is, the correction verifying section 240 determines that the error correcting operation has been successfully performed for the actual error bits included in the first data dt1.

Figure 5A:
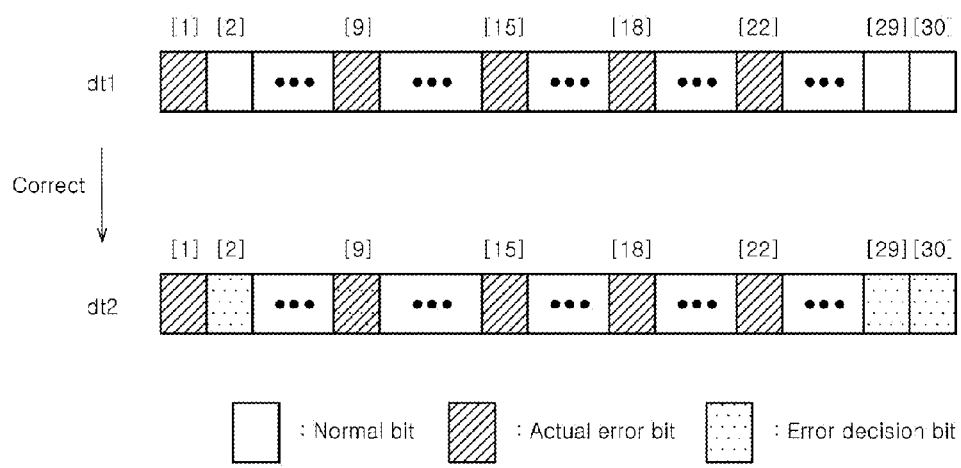
FIGS. 5A and 5B further illustrate another operation of the correction verifying section shown in FIG. 1 according to an embodiment.
Figure 5B:
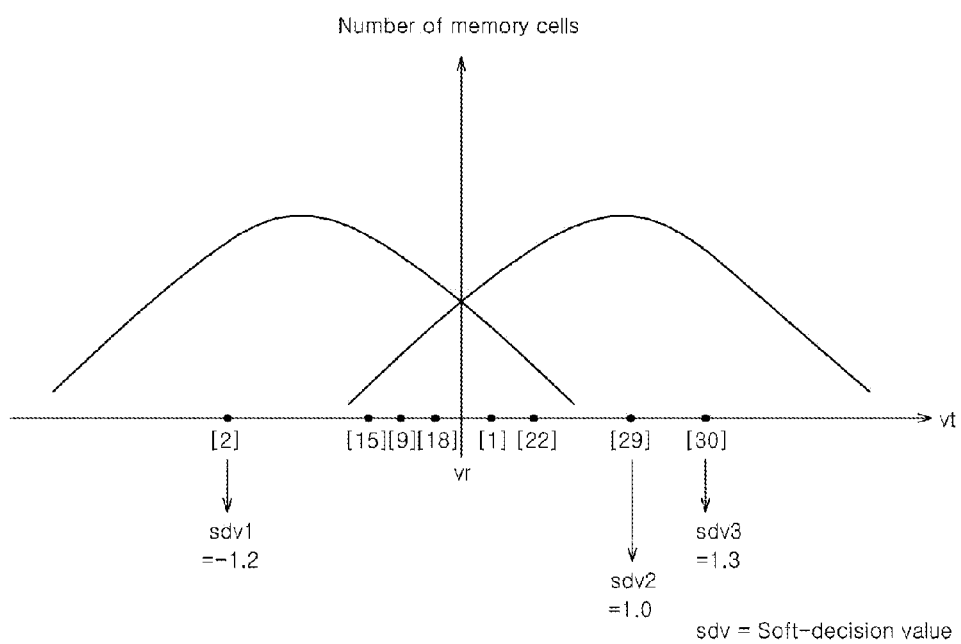

FIGS. 5A and 5B illustrate in detail another operation of the correction verifying section 240 shown in FIG. 1. FIGS. 5A and 5B show the case where the correction verifying section 240 determines that an error correcting operation which is the pre-correction success is a correction fail. FIG. 5A shows the first data dt1 including actual error bits 1, 9, 15, 18, and 22 and normal bits 2, 29, and 30, the second data dt2 including actual error bits 1, 9, 15, 18, and 22 and error decision bits 2, 29, and 30, and FIG. 5B illustrates a graph showing threshold voltage distributions of memory cells corresponding to the bits 1, 2, 9, 15, 18, 22, 29, and 30. The threshold voltages of the memory cells corresponding to the bits 1, 2, 9, 15, 18, 22, 29, and 30 are indicated on the horizontal axis of the graph.

For the second, twenty-ninth and thirtieth bits, the absolute values of the differences between the respective threshold voltages of the corresponding memory cells and the reference voltage vr may be relatively large. As a result, the second, twenty-ninth and thirtieth bits may be determined as normal bits without errors.

For the first, ninth, fifteenth, eighteenth and twenty-second bits, the absolute values of the differences between the respective threshold voltages of the corresponding memory cells and the reference voltage vr may be relatively small. In this case, the first, ninth, fifteenth, eighteenth and twenty-second bits may be determined as error bits.

In an embodiment, the error correction capability of the error correcting section 230 is 3. When the first data dt1 include the 5 error bits exceeding the error correction capability, the error correcting section 230 may in some exceptional cases not indicate the correction fail but may instead wrongly indicate the pre-correction success. In an exceptional case, the error correcting section 230 wrongly determines one or more normal bits, instead of or in addition to the actual error bits included in the first data dt1, as being error bits. FIG. 5A shows three normal bits, e.g. the second, twenty-ninth and thirtieth bits, as wrongly determined to be error bits and as a result having the error correcting operation performed on them.

In order to verify the error correcting operation, the correction verifying section 240 calculates soft-decision values sdv1, sdv2 and sdv3 corresponding to the error decision bits, that is, the second, twenty-ninth and thirtieth bits, respectively, as shown in FIG. 5B. The soft-decision values sdv1, sdv2 and sdv3 may be the differences between the threshold voltages of the memory cells corresponding to the error decision bits and the reference voltage yr.

The correction verifying section 240 calculates the error reliability as the accumulated sum of the absolute values of the soft-decision values sdv1, sdv2 and sdv3, having the values −1.2, 1.0, and 1.3, respectively, as follows:

Error reliability=abs(−1.2)+abs(1.0)+abs(1.3)=3.5, wherein the 'abs' function is the absolute value function.

The reliability threshold value defined as aforementioned may be expressed as follows, in which the experiment variable may be obtained by routine experimentation and is assumed to be 0.5 in the present embodiment:

Reliability threshold value=the number of error decision bits*experiment variable=3*0.5=1.5

The correction verifying section 240 performs a comparison between the error reliability and the reliability threshold value. As a result of the comparison, since the error reliability (=3.5) exceeds the reliability threshold value (=1.5), the correction verifying section 240 indicates that the error correcting operation is the correction fail. The correction verifying section 240 determines that the error decision bits are not the actual error bits included in the first data dt1 but are instead normal bits. That is, the correction verifying section 240 decides that the error correcting operation has been wrongly performed not on the actual error bits included in the first data dt1 but instead on the normal bits.

In this case, as the controller 200 does not transmit the corresponding second data dt2 to the external device when the correction verifying section 240 determines the error correcting operation is the correction fail, the data reliability of the data storage device 10 may be improved.

As is apparent from the above descriptions, the data storage device in accordance with the embodiments of the present disclosure may improve data reliability.

While embodiments have been described above, it will be understood by those skilled in the art that the embodiments described are by way of illustration only. Accordingly, the data storage device and the operating method thereof described herein should not be limited based on the described embodiments. Rather, the data storage device and the operating method thereof described herein should only be limited in light of the claims that follow when taken in conjunction with the above description and accompanying drawings.

What is claimed is:

1. An operating method of a data storage device, the method comprising:
    performing an error correcting operation for first data; and
    when a result of the error correcting operation is indicated as a pre-correction success, verifying the error correcting operation by:
        detecting one or more error decision bits, each error decision bit being a bit determined as an error by the error correcting operation;
        determining an error reliability corresponding to the error decision bits; and
        determining whether at least one of the error decision bits is a normal bit based on the error reliability.

2. The method according to claim 1, wherein determining the error reliability comprises:
    calculating one or more soft-decision values corresponding to the one or more error decision bits.

3. The method according to claim 2, wherein calculating each soft-decision value comprises:
    acquiring a threshold voltage of a memory cell corresponding to the corresponding error decision bit; and
    calculating a difference between the threshold voltage and a reference voltage, as the soft-decision value.

4. The method according to claim 2, wherein determining the error reliability further comprises:
    performing an accumulation of absolute values of the one or more soft-decision values; and
    calculating the error reliability based on a result of the accumulation.

5. The method according to claim 1, wherein detecting the one or more error decision bits comprises:
    detecting the one or more error decision bits based on the first data and second data generated as a result of the error correcting operation.

6. The method according to claim 1, further comprising:
    reading the first data from a nonvolatile memory apparatus.

7. The method according to claim 1, wherein determining whether the at least one of the error decision bits is the normal bit comprises:
    perform a comparison of the error reliability and a reliability threshold value; and
    determining the error correcting operation as a post-correction success or a correction fail, according to a result of the comparison.

8. The method according to claim 7, wherein the reliability threshold value is proportional to the number of the one or more error decision bits.

9. A data storage device comprising:
    a nonvolatile memory apparatus configured to read first data stored therein; and
    an Error Correcting Code (ECC) circuit configured to perform an error correcting operation for the first data, and when a result of the error correcting operation is indicated as a pre-correction success, verify the error correcting operation by (i) detecting one or more error decision bits, each error decision bit being a bit determined as an error by the error correcting operation, (ii) determining an error reliability corresponding to the error decision bits, and (iii) determining whether at least one of the error decision bits is a normal bit based on the error reliability.

10. The data storage device according to claim 9, wherein when determining the error reliability, the ECC circuit is configured to calculate one or more soft-decision values corresponding to the one or more error decision bits.

11. The data storage device according to claim 10, wherein when determining the error reliability, the ECC circuit is configured to acquire a threshold voltage of a memory cell corresponding to each of the one or more error decision bits, and calculate a difference between the threshold voltage and a reference voltage as a soft-decision value corresponding to said each of the error decision bits.

12. The data storage device according to claim 10, wherein when determining the error reliability, the ECC circuit is configured to perform an accumulation of absolute values of the one or more soft-decision values, and calculate the error reliability based on a result of the accumulation.

13. The data storage device according to claim 9, wherein when detecting the one or more error decision bits, the ECC circuit is configured to detect the one or more error decision bits based on the first data and second data generated as a result of the error correcting operation.

14. The data storage device according to claim 9, wherein when determining whether the at least one of the error decision bits is the normal bit, the ECC circuit is configured to perform a comparison of the error reliability and a reliability threshold value, and determine that the error correcting operation is a post-correction success or a correction fail according to a result of the comparison.

15. The data storage device according to claim 14, wherein the reliability threshold value is proportional to the number of the one or more error decision bits.

16. An operating method of a data storage device, the method comprising:
   performing an error correcting operation for first data;
   detecting an error decision bit, which is determined as an error by the error correcting operation;
   determining an error reliability corresponding to the error decision bit based on a threshold voltage of a memory cell corresponding to the error decision bit; and
   verifying whether an actual error in the first data is corrected through the error correcting operation, based on the error reliability.

17. The method according to claim 16, wherein determining the error reliability comprises:
   calculating a soft-decision value corresponding to the error decision bit.

18. The method according to claim 17, wherein calculating the soft-decision value comprises:
   acquiring the threshold voltage of the memory cell; and
   calculating a difference between the threshold voltage and a reference voltage as the soft-decision value.

19. The method according to claim 17, wherein determining the error reliability further comprises:
   performing an accumulation of an absolute value of the soft-decision value, and calculating the error reliability based on a result of the accumulation.

20. The method according to claim 19, wherein verifying whether the actual error is corrected comprises:
   performing a comparison of the error reliability and a reliability threshold value; and
   determining whether the actual error in the first data is corrected through the error correcting operation according to a result of the comparison.

* * * * *